United States Patent
Minamisawa

(10) Patent No.: US 11,246,221 B2
(45) Date of Patent: Feb. 8, 2022

(54) OPTICAL UNIT AND BENDING ASSIST MEMBER

(71) Applicant: NIDEC SANKYO CORPORATION, Nagano (JP)

(72) Inventor: Shinji Minamisawa, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 17/163,566

(22) Filed: Feb. 1, 2021

(65) Prior Publication Data
US 2021/0251080 A1 Aug. 12, 2021

(30) Foreign Application Priority Data

Feb. 7, 2020 (JP) .............................. JP2020-019278
Feb. 27, 2020 (JP) .............................. JP2020-031994

(51) Int. Cl.
*H05K 1/00* (2006.01)
*H05K 1/18* (2006.01)
*G03B 5/00* (2021.01)

(52) U.S. Cl.
CPC ............... *H05K 1/189* (2013.01); *G03B 5/00* (2013.01); *H05K 2201/056* (2013.01)

(58) Field of Classification Search
CPC .................... H05K 1/189; H05K 2201/056
USPC ......................................................... 361/749
See application file for complete search history.

(56) References Cited

U.S. PATENT DOCUMENTS

| 9,291,832 B2 | 3/2016 | Minamisawa et al. |
| 2011/0103782 A1* | 5/2011 | Tsuruta ................. G03B 17/00 396/55 |
| 2015/0370086 A1* | 12/2015 | Hamada ............... H04N 5/2254 359/557 |

FOREIGN PATENT DOCUMENTS

JP 2011232708 11/2011

* cited by examiner

*Primary Examiner* — Andargie M Aychillhum
(74) *Attorney, Agent, or Firm* — JCIPRNET

(57) ABSTRACT

An optical unit may include a movable body having an optical module, a fixed body, a support mechanism which turnably supports the movable body with respect to the fixed body with one or a plurality of directions intersecting an optical axis direction as a direction of a turning axis, and a flexible wiring board whose one end is connected with a connection part provided in the movable body and which is provided with a flat face region facing the optical axis direction. The flat face region is disposed on a side in a first intersecting direction intersecting the optical axis direction with respect to the movable body and is provided with a curved part curved without overlapping in the optical axis direction and is structured so that at least a part of the flat face region is overlapped with a position of the turning axis in the optical axis direction.

23 Claims, 17 Drawing Sheets

OPTICAL UNIT AND BENDING ASSIST MEMBER

CROSS REFERENCE TO RELATED APPLICATION

The present application claims priority under 35 U.S.C. § 119 to Japanese Applications No. 2020-019278 filed on Feb. 7, 2020 and No. 2020-031994 filed on Feb. 27, 2020, and the entire content of which is incorporated herein by reference.

TECHNICAL FIELD

The present invention relates to an optical unit and a bending assist member.

BACKGROUND

Conventionally, various optical units have been used which include a movable body having an optical module, a fixed body which holds the movable body in a displaceable manner, and a flexible wiring board which is connected with the movable body. For example, in Japanese Patent Laid-Open No. 2011-232708 (Patent Literature 1), an optical unit is disclosed which includes a movable module which holds an optical element, a fixed body which holds the movable module in a displaceable manner, and a flexible wiring board whose one end is connected with the movable module in a state that the flexible wiring board is folded at a position overlapping with the movable module in an optical axis direction.

In a conventional optical unit which includes a movable body, a fixed body and a flexible wiring board, the flexible wiring board is displaced with displacement of the movable body and thus, a load is applied to the flexible wiring board accompanied with displacement of the flexible wiring board and the flexible wiring board may be damaged. In the optical unit disclosed in Patent Literature 1, the flexible wiring board is disposed in a folded state and thus, a length of the flexible wiring board can be increased and a load applied to the flexible wiring board can be reduced. However, in the structure that a flexible wiring board is disposed in a folded state as described above, there is a case that a folding method of a flexible wiring board is difficult and a folded shape may vary with passage of time. Further, variation of a folded shape may cause variation of a reduction effect of a load which is applied to a flexible wiring board.

SUMMARY

In view of the problems described above, at least an embodiment of the present invention may provide an optical unit which is capable of reducing a load applied to a flexible wiring board in a simple structure.

According to at least an embodiment of the present invention, there may be provided an optical unit including a movable body having an optical module, a fixed body, a support mechanism which turnably supports the movable body with respect to the fixed body with one or a plurality of directions intersecting an optical axis direction as a direction of a turning axis, and a flexible wiring board whose one end is connected with a connection part provided in the movable body and which is provided with a flat face region facing the optical axis direction, the flat face region being disposed with respect to the movable body on a side in a first intersecting direction which intersects the optical axis direction. The flat face region is provided with a curved part which is curved without overlapping in the optical axis direction and is structured so that at least a part of the flat face region is overlapped with a position of the turning axis in the optical axis direction.

According to this embodiment, the optical unit includes a flexible wiring board provided with a flat face region having a curved part. According to this structure, a length of the flexible wiring board can be increased and a load applied to the flexible wiring board can be reduced. Further, the flat face region is structured so that at least a part of the flat face region is overlapped with a position of the turning axis in the optical axis direction. According to this structure, the flexible wiring board is capable of efficiently permitting turning of the movable body. In addition, the curved part is structured so as to be curved without overlapping in the optical axis direction and thus, the optical unit can be easily manufactured because a bending method of the flexible wiring board is not difficult. Therefore, a load applied to the flexible wiring board can be reduced in a simple structure.

In the optical unit in accordance with at least an embodiment of the present invention, it may be structured that the flexible wiring board is, from the one end side connected with the connection part toward the other end side, bent at a first bent part so as to approach the position of the turning axis in the optical axis direction, and bent at a second bent part on the other end side with respect to the first bent part and thereby the other end side structures the flat face region. According to this structure, a structure that the flat face region and the turning axis are overlapped with each other in the optical axis direction can be easily formed.

Further, according to at least an embodiment of the present invention, there may be provided an optical unit including a movable body having an optical module, a fixed body, a support mechanism which turnably supports the movable body with respect to the fixed body with one or a plurality of directions intersecting an optical axis direction as a direction of a turning axis, and a flexible wiring board whose one end is connected with a connection part provided in the movable body and which is provided with a flat face region facing the optical axis direction, the flat face region being disposed with respect to the movable body on a side in a first intersecting direction which intersects the optical axis direction. The flat face region is provided with a curved part which is curved without overlapping in the optical axis direction, the flexible wiring board is provided with a bent part and is bent at the bent part so that the flat face region approaches a position of the turning axis in the optical axis direction with respect to the connection part.

According to this embodiment, the optical unit includes a flexible wiring board provided with a flat face region having a curved part. Therefore, a length of the flexible wiring board can be increased and a load applied to the flexible wiring board can be reduced. Further, the flexible wiring board is provided with a bent part and is bent at the bent part so that the flat face region approaches the position of the turning axis with respect to the connection part in the optical axis direction. According to this structure, the position of the flat face region is capable of approaching the turning axis in the optical axis direction and thus, the flexible wiring board is capable of allowing the movable body to turn efficiently. In addition, the curved part is structured so as to be curved without overlapping in the optical axis direction and thus, the optical unit can be easily manufactured because a bending method of the flexible wiring board is not difficult. Therefore, a load applied to the flexible wiring board can be reduced in a simple structure.

In the optical unit in accordance with at least an embodiment of the present invention, it is preferable that the optical unit includes a bending assist member which assists to maintain a bent state of the flexible wiring board. According to this structure, the bending assist member is provided and thus, the position in the optical axis direction of the flat face region is easily maintained.

In the optical unit in accordance with at least an embodiment of the present invention, it is preferable that the bending assist member is structured so as to maintain the flexible wiring board in the bent state that the flexible wiring board is bent twice at a bending angle of 90 degrees or less. According to this structure, the flexible wiring board is structured so as to be bent twice at a bending angle of 90 degrees or less and thus, the flat face region is capable of approaching in the optical axis direction without excessively applying a load to the flexible wiring board.

In the optical unit in accordance with at least an embodiment of the present invention, it is preferable that the bending assist member is structured so that two bending angles of the flexible wiring board are the same as each other and their bending directions are opposite to each other. According to this structure, a bending structure of the flexible wiring board can be simplified.

In the optical unit in accordance with at least an embodiment of the present invention, it is preferable that the bending assist member is structured so that the bending assist member holds the flexible wiring board in a holding region between two bent portions of the flexible wiring board. According to this structure, the flexible wiring board is surely held by the bending assist member.

In the optical unit in accordance with at least an embodiment of the present invention, it is preferable that the bending assist member is provided with plate parts which are provided at positions separated from the holding region so as to contact with the flexible wiring board from an outer side in a bending direction to determine a bending angle of the flexible wiring board at the two bent portions. According to this structure, a bending angle of the flexible wiring board can be easily restrained from deviating from a predetermined angle by the plate part.

In the optical unit in accordance with at least an embodiment of the present invention, it is preferable that the bending assist member is provided with an opening part in the holding region and is structured so as to be capable of holding the flexible wiring board by fitting the holding region to the flexible wiring board from a side of the opening part, and so that a tip end side of the opening part is widened. According to this structure, the bending assist member can be easily attached to the flexible wiring board.

In the optical unit in accordance with at least an embodiment of the present invention, it is preferable that the flexible wiring board is structured in a multilayer structure. According to this structure, the flexible wiring board which is capable of efficiently transmitting and receiving signals can be easily formed.

In the optical unit in accordance with at least an embodiment of the present invention, it is preferable that the flexible wiring board is provided with a non-adhesion region where respective layers are not bonded to each other in a region of the multilayer structure. According to this structure, the non-adhesion region is particularly flexible and thus, a load applied to the flexible wiring board can be reduced efficiently.

In the optical unit in accordance with at least an embodiment of the present invention, it is preferable that the optical unit includes a yawing turning axis along the first intersecting direction as the turning axis, the flat face region is provided with a plurality of the curved parts, and the curved parts are line-symmetrically disposed in the flat face region with the yawing turning axis as a reference or point-symmetrically disposed in the flat face region when viewed in the optical axis direction. According to this structure, the curved parts are line-symmetrically disposed in the flat face region with the yawing turning axis as a reference or point-symmetrically disposed in the flat face region when viewed in the optical axis direction and thus, a stress difference and an electric current difference in a case of yawing of the movable body can be reduced.

In the optical unit in accordance with at least an embodiment of the present invention, it is preferable that, in the flat face region, the flexible wiring board is curved in a direction approaching the movable body or in a direction separating from the movable body in the curved part. According to this structure, a length of the flexible wiring board is easily increased and thus, a load applied to the flexible wiring board can be easily and efficiently reduced.

Further, in accordance with at least an embodiment of the present invention, a bending assist member is preferably used which is structured to maintain a flexible wiring board in a state that the flexible wiring board is bent at a first bent part and a second bent part. The bending assist member holds the flexible wiring board in a holding region between the first bent part and the second bent part, and the bending assist member is provided with plate parts which maintain the flexible wiring board in a state that the flexible wiring board is bent at the same bending angle of 90 degrees or less at the first bent part and the second bent part so that their bending directions are opposite to each other, and the plate parts are provided at positions separated from the holding region so as to be contacted with the flexible wiring board from an outer side in the bending direction to determine a bending angle of the flexible wiring board at the first bent part and the second bent part.

In accordance with at least an embodiment of the present invention, specifically, it is preferable that the bending assist member is provided with an opening part in the holding region, the flexible wiring board can be held by fitting the holding region to the flexible wiring board from a side of the opening part, and a tip end side of the opening part is widened.

According to the optical unit in accordance with the present invention, a load which is applied to the flexible wiring board can be reduced in a simple structure.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Embodiments of the present invention will be described below with reference to the accompanying drawings. The same reference signs are used in the same structures in the respective embodiments, and the respective structures are described only in the first embodiment and their descriptions will be omitted in the following embodiments.

First Embodiment

Figure 1:
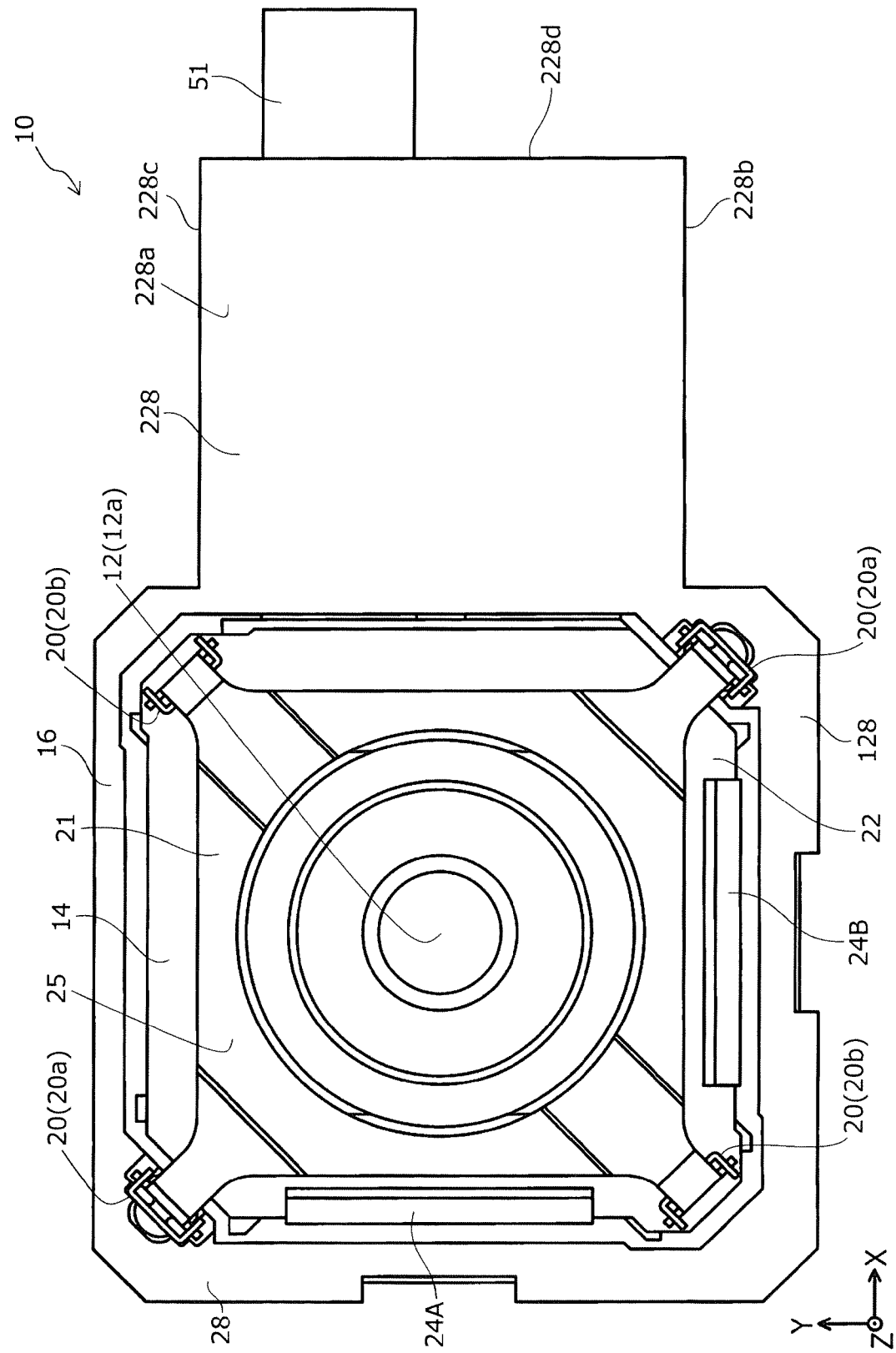
FIG. 1 is a plan view showing an optical unit in accordance with a first embodiment of the present invention.
Figure 2:
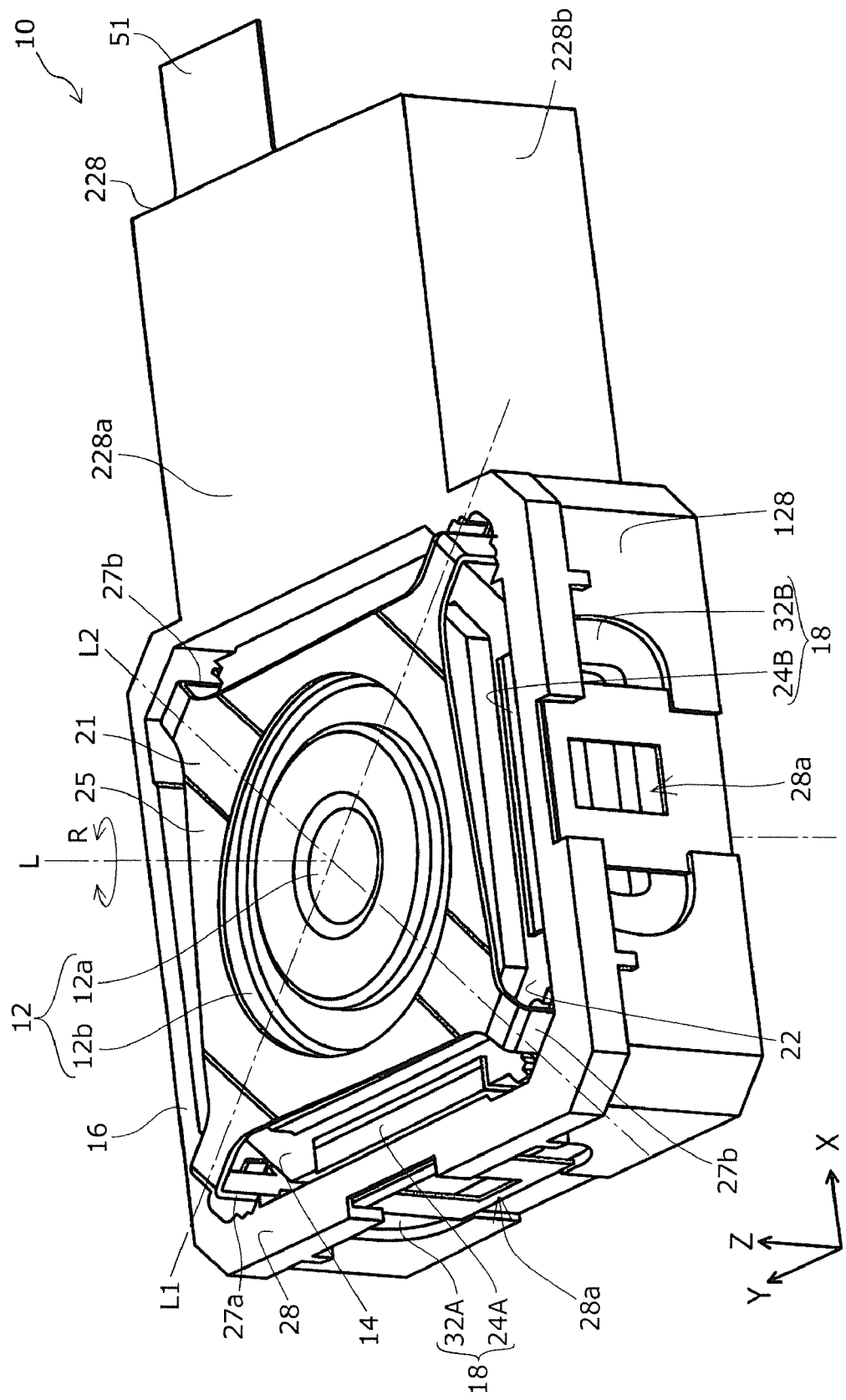
FIG. 2 is a perspective view showing an optical unit in accordance with a first embodiment of the present invention.
Figure 3:
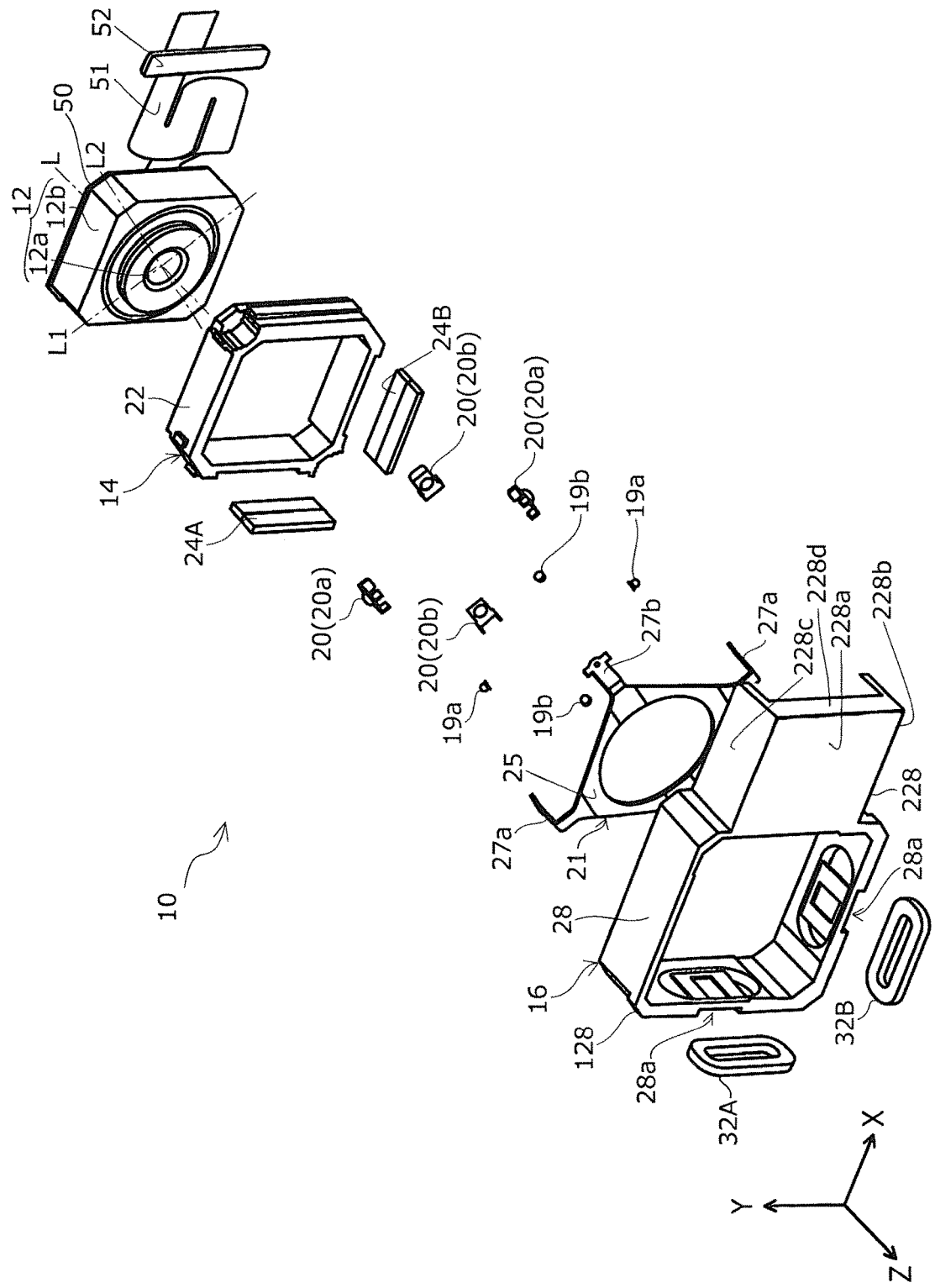
FIG. 3 is an exploded perspective view showing an optical unit in accordance with to a first embodiment of the present invention.

First, an optical unit in accordance with a first embodiment of the present invention will be described below with reference to FIGS. 1 through 7. In FIGS. 2 and 3, an alternate long and short dash line with the reference sign "L" indicates an optical axis, an alternate long and short dash line with the reference sign "L1" indicates a first axial line intersecting the optical axis, and an alternate long and short dash line with the reference sign "L2" indicates a second axial line "L2" intersecting the optical axis "L" and the first axial line "L1". The "R" direction is a direction around the optical axis "L". Further, in the respective drawings, the "Z"-axis direction is the optical axis direction, the "X"-axis direction is a direction intersecting the optical axis, in other words, an axial direction of yawing, and the "Y"-axis direction is a direction intersecting the optical axis, in other words, an axial direction of pitching.

<Schematic Entire Structure of Optical Unit>

A schematic structure of an optical unit 10 in accordance with a first embodiment of the present invention will be described below with reference to FIGS. 1 through 4. The optical unit 10 includes a movable body 14 having an optical module 12 and a fixed body 16 which holds the movable body 14 in a displaceable state in a direction (pitching direction) with the "Y"-axis direction as a turning axis and in a direction (yawing direction) with the "X"-axis direction as a turning axis. Further, the optical unit 10 includes a turning drive mechanism 18 structured to drive the movable body 14 in the pitching direction and the yawing direction, and a support mechanism 20 which turnably supports the movable body 14 with respect to the fixed body 16 in the pitching direction and the yawing direction. In addition, the optical unit 10 includes a gimbal mechanism 21 which is structured so that first support parts 19a for turnably supporting the movable body 14 around the first axial line "L1" are provided in first support part extended parts 27a and that second support parts 19b turnably supported by a member on the fixed body 16 side around the second axial line "L2" are provided in second support part extended parts 27b (see FIG. 3).

<Optical Module>

In this embodiment, the optical module 12 is formed in a substantially rectangular case shape and is, for example, used as a thin camera mounted on a cellular phone with a camera or a tablet type PC, or the like. The optical module 12 includes a lens 12a on an object side, and an optical device for imaging and the like are incorporated in an inside of the rectangular case-shaped housing 12b. The optical module 12 in this embodiment is, as an example, incorporated with an actuator structured to correct a shake of pitching (shake in a turning direction with the "Y"-axis direction as a turning axis) and a shake of yawing (shake in a turning direction with the "X"-axis direction as a turning axis) occurred in the optical module 12 and is structured so that a shake correction of pitching and a shake correction of yawing can be performed.

In this embodiment, the optical module 12 is structured so as to be capable of correcting a shake of pitching and a shake of yawing. However, the present invention is not limited to this structure and, for example, the optical module 12 may be structured so as to be capable of correcting one of a shake of pitching and a shake of yawing.

<Movable Body>

In FIGS. 1 through 4, the movable body 14 includes the optical module 12, a holder frame 22 and magnets 24A and 24B. The holder frame 22 is structured as a rectangular frame-shaped member which is provided so as to surround four side faces except a front face (face on the object side) where the lens 12a of the optical module 12 is provided and a rear face on the opposite side. The holder frame 22 in this embodiment is, as an example, structured so that the optical module 12 is detachably provided. Two magnets 24A and 24B for correcting pitching and yawing are attached to outer faces of the holder frame 22 by utilizing two faces of the holder frame 38 which face the fixed body 16.

<Fixed Body>

In FIGS. 1 through 4, the fixed body 16 includes a fixed frame 28 and coils 32A and 32B. In this embodiment, the fixed frame 28 is structured of a rectangular frame-shaped member 128, which is provided so as to surround at least three faces of the holder frame 22 of the movable body 14 in a direction around the optical axis ("R" direction), and an extended part 228 extended to an outer side along the "X"-axis direction which is provided with a wall part 228a, a wall part 228b, a wall part 228c and a wall part 228d. The wall part 228a is a wall part which covers a front face (face on the object side), the wall part 228b and the wall part 228c are wall parts covering in the "Y"-axis direction, and the wall part 228d is a wall part covering an opposite side to a side where the movable body 14 is disposed in the "X"-axis direction. In addition, although not shown in FIGS. 1 through 4, a wall part is provided on a side facing the wall part 228a in the "Z"-axis direction.

The fixed body 16 in this embodiment is structured so as to be capable of covering a flexible wiring board 51 described below by the wall part 228a, the wall part 228b, the wall part 228c, the wall part 228d and the wall part not shown on a side facing the wall part 228a. In addition, the fixed body 16 is provided with a positioning part 52 (see FIG. 4) which positions the flexible wiring board 51 in the "Y"-axis direction and the "Z"-axis direction. When a cover which covers at least a part of the flexible wiring board 51 is provided like the optical unit 10 in this embodiment, damage of the flexible wiring board 51 due to contact with other structure members can be restrained.

As shown in FIG. 2 and the like, the coils 32A and 32B are respectively attached to the coil attaching parts 28a. In this embodiment, each of the coil 32A and the coil 32B is, as an example, structured of a winding coil, but may be structured of a pattern substrate (coil substrate) in which a coil is incorporated into wiring in a substrate as a pattern.

In this embodiment, in a state that the movable body 14 is disposed in an inside of the fixed body 16, the magnet 24A and the coil 32A face each other, and the magnet 24B and the coil 32B face each other. Further, in this embodiment, a pair of the magnet 24A and the coil 32A and a pair of the magnet 24B and the coil 32B structure the turning drive mechanism 18. Corrections of pitching and yawing of the movable body 14 are performed by the turning drive mechanism 18.

Further, corrections of pitching and yawing are performed as follows. When a shake of both directions or either one direction of a pitching direction and a yawing direction is generated in the optical unit 10, the shake is detected by a magnetic sensor (Hall element) not shown and the turning drive mechanism 18 is driven based on the result. Alternatively, a shake of the optical unit 10 may be detected by using a shake detection sensor (gyroscope) or the like. The turning drive mechanism 18 is operated so as to correct the shake based on a detected result of the shake. In other words, an electric current is supplied to the respective coils 32A and 32B so that the movable body 14 is moved in a direction for canceling the shake of the optical unit 10 and thereby the shake is corrected.

As described above, the optical unit 10 in this embodiment includes the turning drive mechanism 18 structured to turn the movable body 14 with respect to the fixed body 16 with the axial direction of pitching and the axial direction of yawing as turning axes. In this embodiment, it is preferable that the turning drive mechanism 18 is disposed at a position other than a side where the flexible wiring board 51 is disposed with respect to the movable body 14 in the "X"-axis direction (other than a side in the first direction intersecting the optical axis direction). When the turning drive mechanism 18 is disposed on a side where the flexible wiring board 51 is not provided, a size of the optical unit 10 is not required to increase for preventing the turning drive mechanism 18 from contacting with the flexible wiring board 51 and thus, a size of the optical unit 10 can be reduced. In this embodiment, the word "turning" in the present specification does not require turning of 360° and includes a case of a swing in a turning direction.

A drive source for performing a correcting operation of a shake is not limited to a voice coil motor which is structured of respective pairs of the coils 32A and 32B and the magnets 24A and 24B like the turning drive mechanism 18. A stepping motor, a piezo element or the like may be also utilized as the drive source.

<Support Mechanism>

The support mechanism 20 includes a metal plate 20a, which is formed with a protruding curved face in a hemispherical shape toward an outer side of the optical unit 10, and a metal plate 20b which is formed with a protruding curved face in a hemispherical shape toward an inner side of the optical unit 10. The metal plate 20a is disposed at two positions facing each other of four corners of the rectangular frame-shaped member 128 of the fixed body 16, and the metal plate 20b is disposed at two positions facing each other of four corners of the rectangular frame-shaped movable body 14. The rectangular frame-shaped member 128 and the rectangular frame-shaped movable body 14 are disposed so that their positions of four corners are aligned, and the metal plate 20a and the metal plate 20b are disposed at four corners one by one.

In the support mechanism 20 in this embodiment, each of first support parts 19a provided in first support part extended parts 27a of the gimbal mechanism 21 is disposed on an inner side of the protruding curved face in a hemispherical shape of the metal plate 20a which faces an outer side. The support mechanism 20 supports the gimbal mechanism 21 with respect to the fixed body 16 by the structure described above. Further, each of second support parts 19b provided in second support part extended parts 27b of the gimbal mechanism 21 is disposed on an inner side of the protruding curved face in a hemispherical shape of the metal plate 20b which faces an inner side. The support mechanism 20 supports the gimbal mechanism 21 with respect to the movable body 14 by the structure described above. In other words, the support mechanism 20 in this embodiment is structured so as to be capable of turnably supporting the movable body 14 with respect to the fixed body 16 in one or a plurality of directions (at least one direction of the "X"-axis direction and the "Y"-axis direction) intersecting the optical axis direction ("Z"-axis direction) as a turning axis direction. The support mechanism 20 in this embodiment is structured so as to be capable of turning of the movable body 14 with the axial direction of pitching as a turning axis and capable of turning of the movable body 14 with the axial direction of yawing as a turning axis. However, the support mechanism 20 may be structured so as to be capable of also turning in a rolling direction of the movable body 14.

<Gimbal Mechanism>

The gimbal mechanism 21 is a mechanism which is formed by bending a flat plate member made of metal and provided with a spring property. Specifically, the gimbal mechanism 21 is, as an example, structured of a gimbal frame part 25 provided on an object side, and the first support part extended parts 27a and the second support part extended parts 27b which are formed by bending by 90° in the optical axis direction from four corner parts of the gimbal frame part 25. In this case, the entire first support part extended part 27a and the entire second support part extended part 27b are not required to be formed in a plate shape, and only parts of the first support part extended part 27a and the second support part extended part 27b may be formed in a plate shape to exhibit a spring property. Further, one of the first support part extended part 27a and the second support part extended part 27b may be formed in another shape (for example, rod shape) other than a plate shape.

<Imaging Element>

Figure 4:
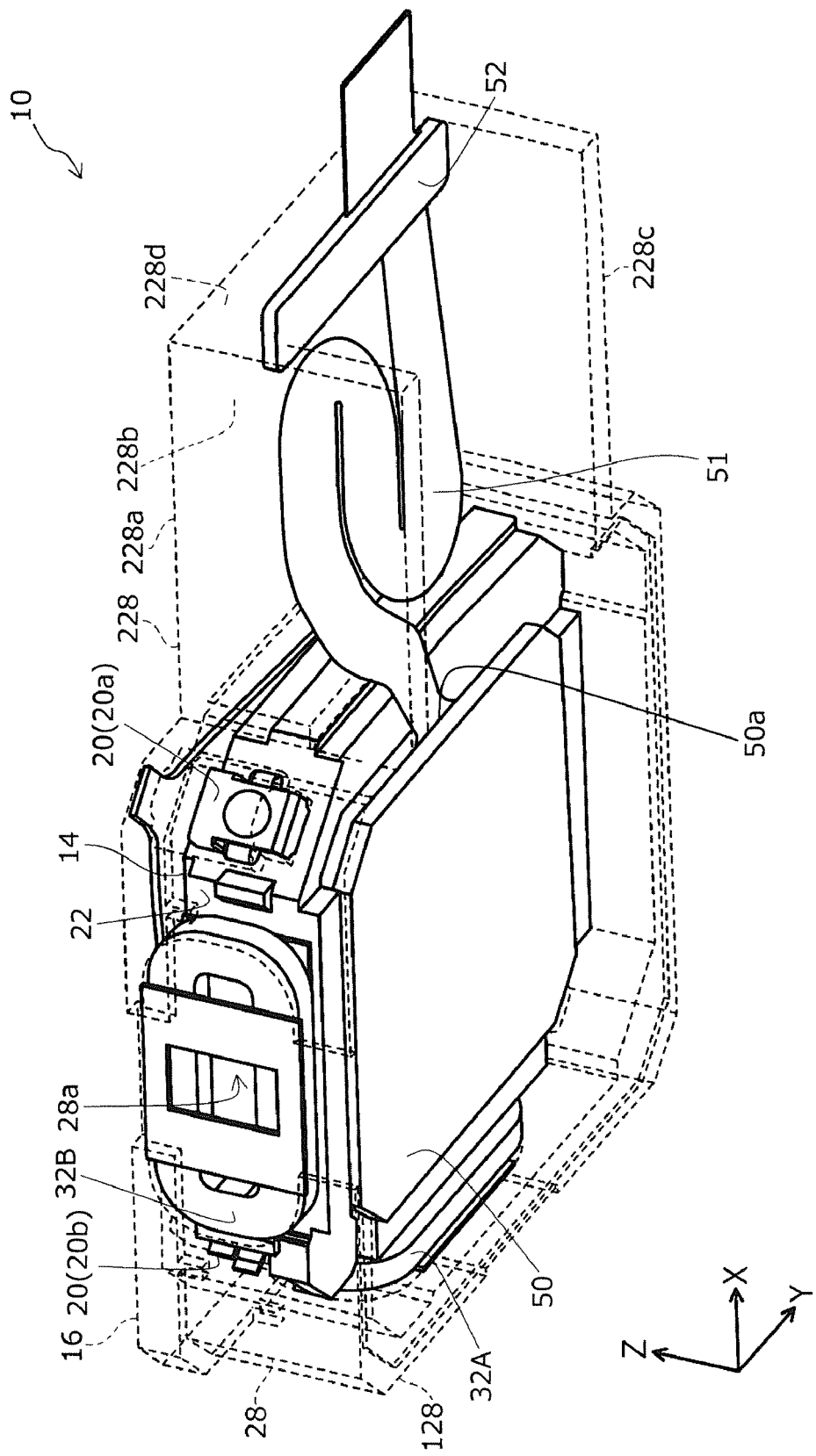
FIG. 4 is a perspective view showing an optical unit in which a fixed body of the optical unit is shown in a transparent manner in accordance with a first embodiment of the present invention.

As shown in FIGS. 3 and 4, the optical module 12 includes an imaging element 50 on an opposite side to an object side. Further, as shown in FIG. 4, a connection part 50a of the imaging element 50 is connected with the flexible wiring board 51. In this embodiment, the connection part 50a of the imaging element 50 is formed on the extended part 228 side, and the wall part 228a, the wall part 228b and the wall part 228c of the extended part 228 are structured so as to cover the flexible wiring board 51 in directions other than an opposite side to an object side. In accordance with an embodiment of the present invention, the connection part 50a of the flexible wiring board 51 is not required to be provided in the imaging element 50 and may be provided in a portion of the movable body 14 other than the imaging element 50.

<Flexible Wiring Board>

As shown in FIG. 4, one end of the flexible wiring board 51 is connected with the connection part 50a provided in the movable body 14. As described above, the flexible wiring board 51 is disposed on a side in the first intersecting direction with respect to the movable body 14. Further, the position in the optical axis direction ("Z"-axis direction) of the other end of the flexible wiring board 51 is determined by the positioning part 52 which is disposed on a side in the first intersecting direction with respect to the movable body 14. In this embodiment, the positioning part 52 is a plate-shaped member which is formed with a space with respect to the wall part 228a on one side in the "Y"-axis direction for passing the flexible wiring board 51 and is fixed to the wall part 228a by a fixing part not shown on the other side in the "Y"-axis direction. When the positioning part 52 is fixed at a predetermined position of the extended part 228, the position of the flexible wiring board 51 is determined in the "Y"-axis direction and in the "Z"-axis direction.

Figure 5:
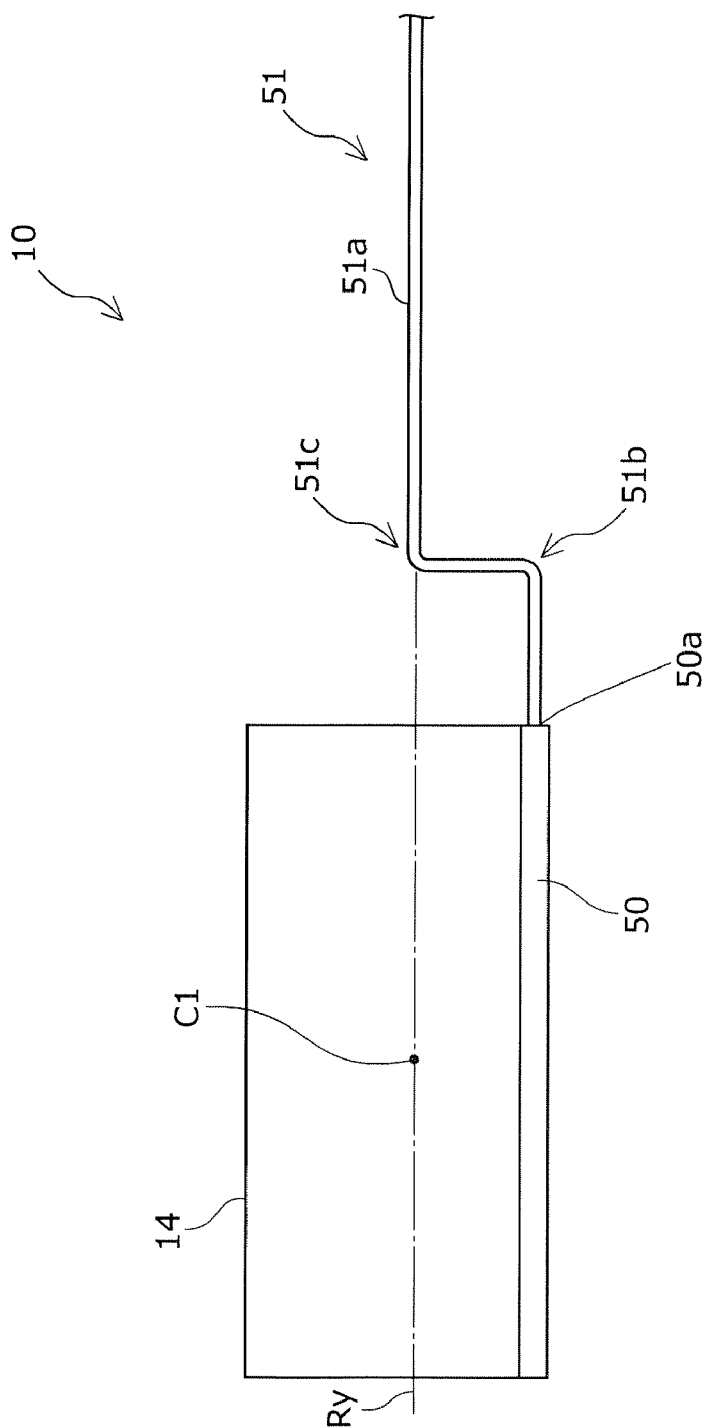
FIG. 5 is a side view showing an arrangement of a flexible wiring board in an optical unit in accordance with a first embodiment of the present invention.
Figure 6:
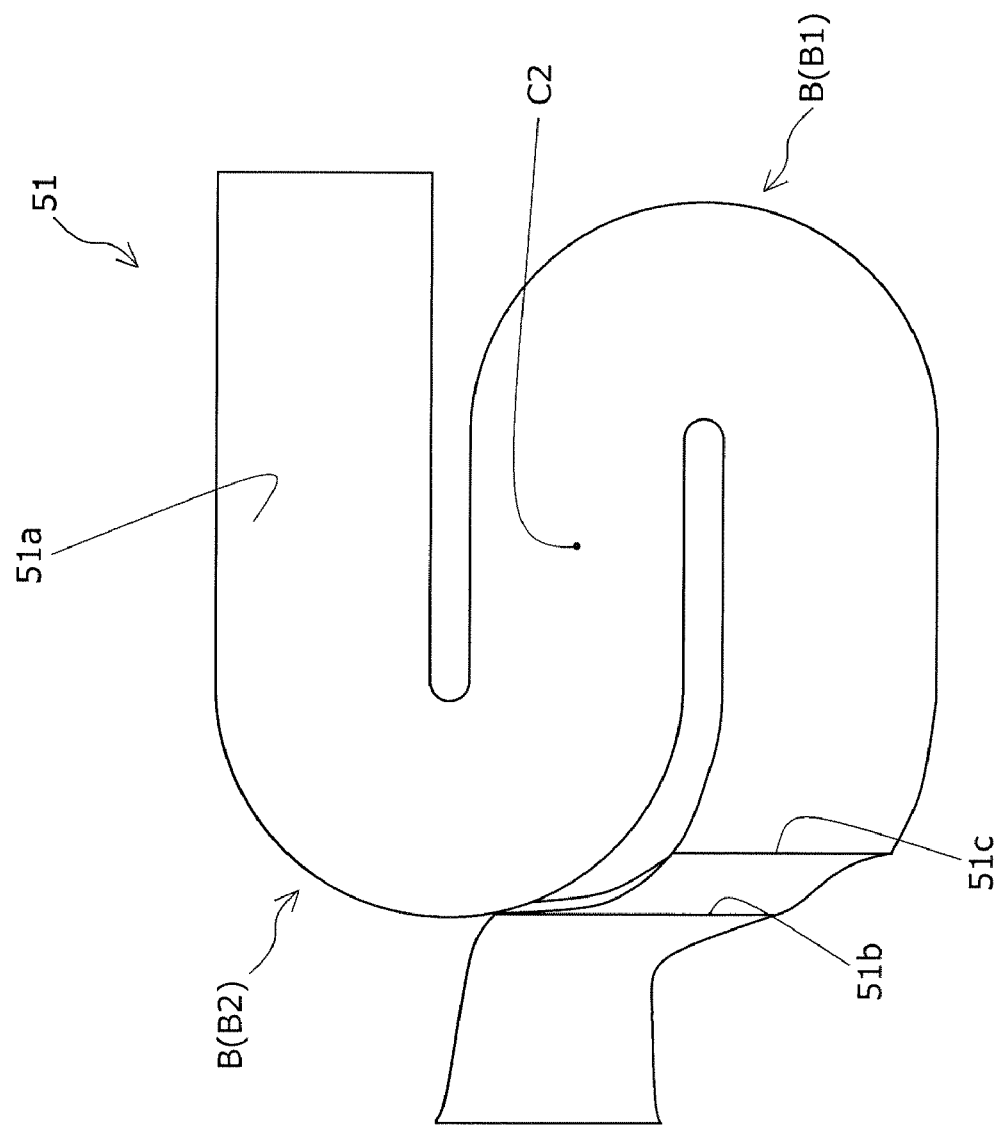
FIG. 6 is a plan view showing a flexible wiring board in an optical unit in accordance with a first embodiment of the present invention.

A further detailed structure of the flexible wiring board 51 will be described below with reference to FIGS. 5 through 7 in addition to FIGS. 1 through 4. As shown in FIGS. 5 and 6 and the like, the flexible wiring board 51 in this embodiment is provided with a flat face region 51a facing in the optical axis direction. Further, as shown in FIG. 5 and the like, the flat face region 51a is disposed on a side in the first intersecting direction with respect to the movable body 14. In addition, as shown in FIG. 6, the flat face region 51a is provided with a curved part "B" which is curved without overlapping in the optical axis direction. In this embodiment, as shown in FIG. 5, the flat face region 51a is structured so as to overlap in the optical axis direction with a position of the turning center "C1" which is an intersecting point of the turning axis "Ry" in the axial direction of yawing with the turning axis not shown in the axial direction of pitching. The expression of the "flat face" in the present specification does not mean a flat shape in a strict meaning. In other words, the expression of the "flat face" may mean a substantial flat face and some bending or protrusions and recesses in some extent are permitted.

Like the flexible wiring board 51 in this embodiment, in a case that the flexible wiring board 51 is structured so as to have the flat face region 51a provided with the curved part "B", a length of the flexible wiring board 51 can be increased and, when the movable body 14 is moved with respect to the fixed body 16, a load applied to the flexible wiring board 51 can be reduced. Further, like the flexible wiring board 51 in this embodiment, when it is structured that at least a part of the flat face region 51a is overlapped with the position of the turning axis (turning center "C1") in the optical axis direction, the flexible wiring board 51 is capable of permitting the movable body 14 to turn efficiently. This is because that the flexible wiring board 51 is capable of permitting the movable body 14 to turn efficiently as the flat face region 51a comes closer to the position of the turning axis in the optical axis direction. In addition, like the flexible wiring board 51 in this embodiment, when the curved part "B" is curved without overlapping in the optical axis direction, the optical unit 10 can be easily manufactured because a bending method of the flexible wiring board 51 is not difficult. Therefore, according to the flexible wiring board 51 in this embodiment, a load applied to the flexible wiring board 51 can be reduced with a simple structure.

In the present specification, a meaning of the word of "overlap" includes an overlapped structure in a strict meaning and, in addition, includes a substantially overlapped state (for example, a state having an error of about ±1 mm). The flat face region 51a may be curved due to influence of gravity but, in a state that the flat face region 51a is curved, when a state that a part of the flat face region 51a is substantially overlapped is existed, the state corresponds to an "overlapping" structure in the present specification.

As shown in FIG. 5 and the like, the flexible wiring board 51 is, from one end side which is connected with the connection part 50a toward the other end side, structured so that the flexible wiring board 51 is bent at a first bent part 51b so as to approach the position of the turning axes (the turning axis "Ry" in the axial direction of yawing and the turning axis in the axial direction of pitching) in the optical axis direction and is bent at a second bent part 51c on the other end side with respect to the first bent part 51b and, in this manner, the other end side structures the flat face region 51a. According to this structure, a structure that the flat face region 51a and the turning axis are overlapped with each other in the optical axis direction can be easily formed.

Further, when expressed in another manner, in the optical unit 10 in this embodiment, the flexible wiring board 51 is bent at the bent part (first bent part 51b and second bent part 51c) so that the flat face region 51a approaches the position of the turning axis in the optical axis direction with respect to the connection part 50a. According to this structure, in the optical unit 10 in this embodiment, the position of the flat face region 51a is capable of approaching the turning axis in the optical axis direction and thus, the flexible wiring board 51 is capable of allowing the movable body 14 to turn efficiently.

As described above, the optical unit 10 in this embodiment is provided with the yawing turning axis (turning axis "Ry" in the axial direction of yawing) along the first intersecting direction ("X"-axis direction) as the turning axis. Further, as shown in FIG. 6, the flat face region 51a is provided with the curved part "B" having a plurality of curved parts, specifically, a first curved part "B1" and a second curved part "B2", and the curved part "B" is disposed in the flat face region 51a so as to be point symmetrical with the reference point "C2" on the extension line of the yawing turning axis as a reference when viewed in the optical axis direction. Like the optical unit 10 in this embodiment, when the curved part "B" is point-symmetrically disposed in the flat face region 51a when viewed in the optical axis direction, a stress difference and an electric current difference in a case of yawing of the movable body 14 can be reduced. Alternatively, the curved part "B" may be line-symmetrically disposed with the yawing turning axis as a reference and, also in this structure, a stress difference and an electric current difference in a case of yawing of the movable body 14 can be reduced. In the optical unit 10 in this embodiment, the curved part "B" is provided with two curved portions in the flat face region 51a, but the number of curved portions of the curved part "B" is not limited, and the number may be one or three or more.

Figure 7:
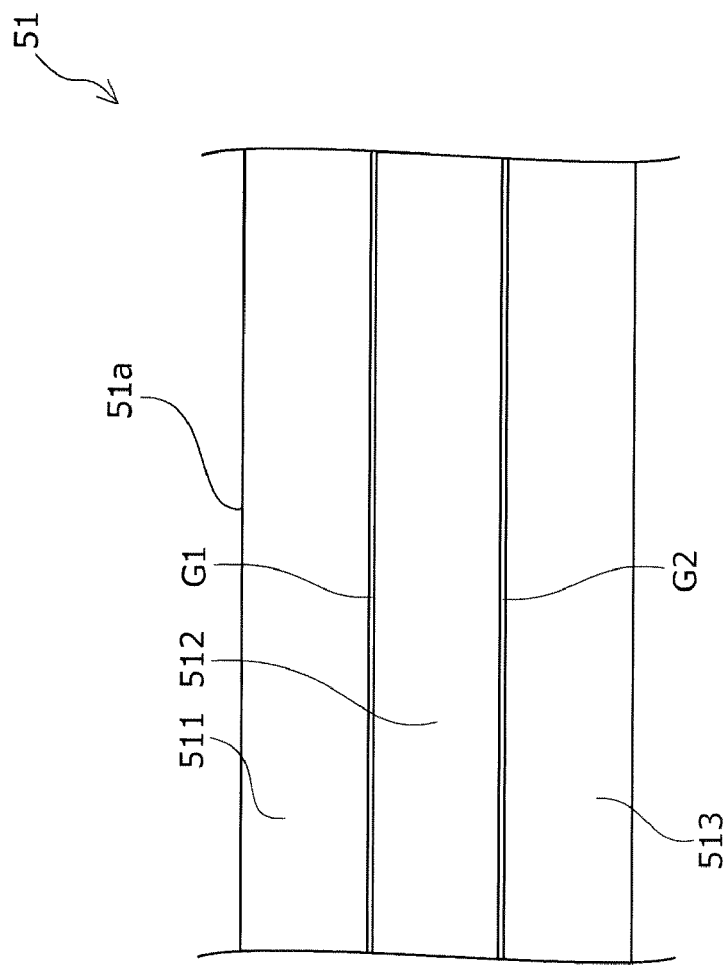
FIG. 7 is an enlarged cross-sectional side view showing a flexible wiring board in an optical unit in accordance with a first embodiment of the present invention.

Further, as shown in FIG. 7, in the optical unit 10 in this embodiment, the flexible wiring board 51 is provided with a multilayer structure having three layers, i.e., a first layer 511, a second layer 512 and a third layer 513. When the flexible wiring board 51 is provided with a multilayer structure, a flexible wiring board capable of efficiently transmitting and receiving signals can be easily formed. In the present specification, the meaning of the expression "multilayer structure" includes all structures that a plurality of layers is laminated, for example, a structure in which all wirings and the like are laminated on only one side, a structure in which wirings and the like are laminated on both sides, and a structure in which three or more layers are laminated.

In the optical unit 10 in this embodiment, the flexible wiring board 51 is provided with no adhesion layer in a gap space "G1" between the first layer 511 and the second layer 512 and in a gap space "G2" between the second layer 512 and the third layer 513. When expressed in another manner, in a region of the multilayer structure, the flexible wiring board 51 is provided with a non-adhesion region where the respective layers are not bonded to each other. The non-adhesion region is especially flexible and thus, when the non-adhesion region is provided, a load applied to the flexible wiring board 51 can be efficiently reduced. However, the present invention is not limited to such a structure, and the flexible wiring board 51 may be a multilayer structure which is not provided with a non-adhesion region.

Second Embodiment

Figure 8:
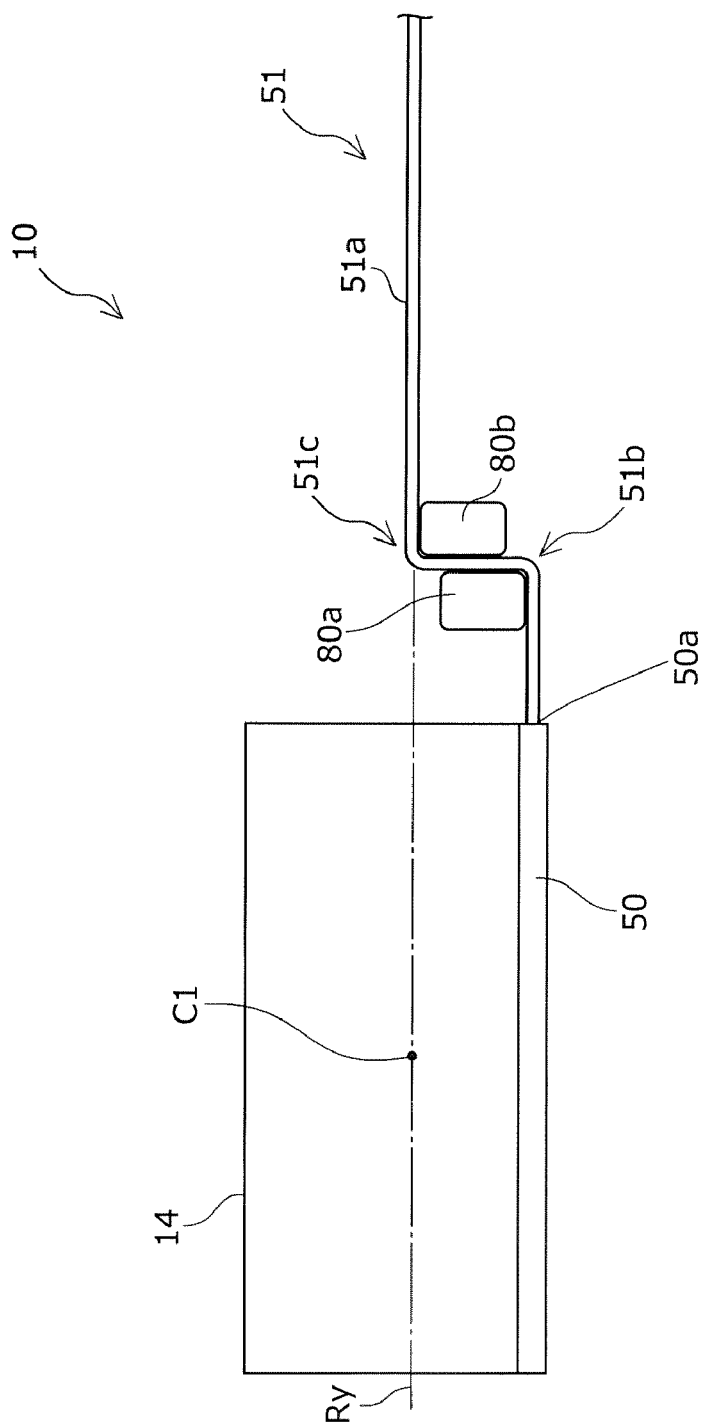
FIG. 8 is a side view showing an arrangement of a flexible wiring board in an optical unit in accordance with a second embodiment of the present invention.

Next, an optical unit 10 in accordance with a second embodiment will be described below. FIG. 8 is a schematic side view showing an optical unit 10 in accordance with a second embodiment and is a view corresponding to FIG. 5 in the optical unit 10 in accordance with the first embodiment. In the second embodiment, the structure members common to the first embodiment are indicated with the same reference signs and their detailed descriptions are omitted. In the second embodiment, the optical unit 10 has similar structures to the optical unit 10 in the first embodiment except that bending assist members 80a and 80b are provided.

The optical unit 10 in this embodiment includes, as shown in FIG. 8, a bending assist member 80a which assists to maintain a bending state of the flexible wiring board 51 at the first bent part 51b, and a bending assist member 80b which assists to maintain a bending state of the flexible wiring board 51 at the second bent part 51c. As described above, when the bending assist members are provided, the position of the flat face region 51a in the optical axis direction is easily maintained.

In this embodiment, both of the bending assist members 80a and 80b are structured of a block-shaped member made of resin. However, the present invention is not limited to this structure and, for example, a metal plate member may be used. Further, the number of the bending assist members is not specifically limited and the bending assist member may be provided in only a part of a bent part.

Third Embodiment

Figure 9:
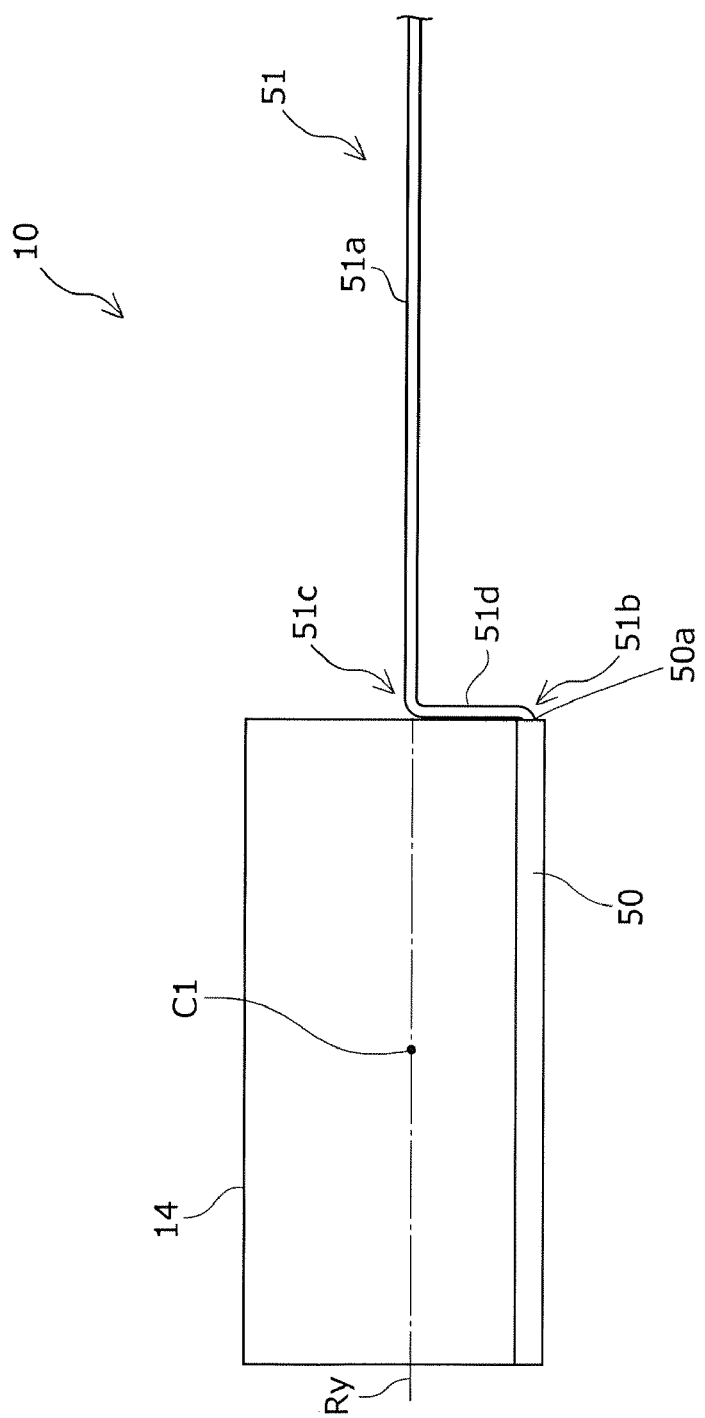
FIG. 9 is a side view showing an arrangement of a flexible wiring board in an optical unit in accordance with a third embodiment of the present invention.

Next, an optical unit 10 in accordance with a third embodiment will be described below. FIG. 9 is a schematic side view showing an optical unit 10 in accordance with a third embodiment and is a view corresponding to FIG. 5 in the optical unit 10 of the first embodiment. In the third embodiment, the structure members common to the first embodiment and the second embodiment are indicated with the same reference signs and their detailed descriptions are omitted. In the third embodiment, the optical unit 10 has similar structures to the optical unit 10 of the first embodiment except arrangement of the first bent part 51b and the second bent part 51c.

In the optical unit 10 in this embodiment, as shown in FIG. 9, the first bent part 51b is provided in the vicinity of the connection part 50a and a region 51d of the flexible wiring board 51 between the first bent part 51b and the second bent part 51c is contacted with the movable body 14. As described above, arrangement of the first bent part 51b and the second bent part 51c is not limited specifically.

Fourth Embodiment

Figure 10:
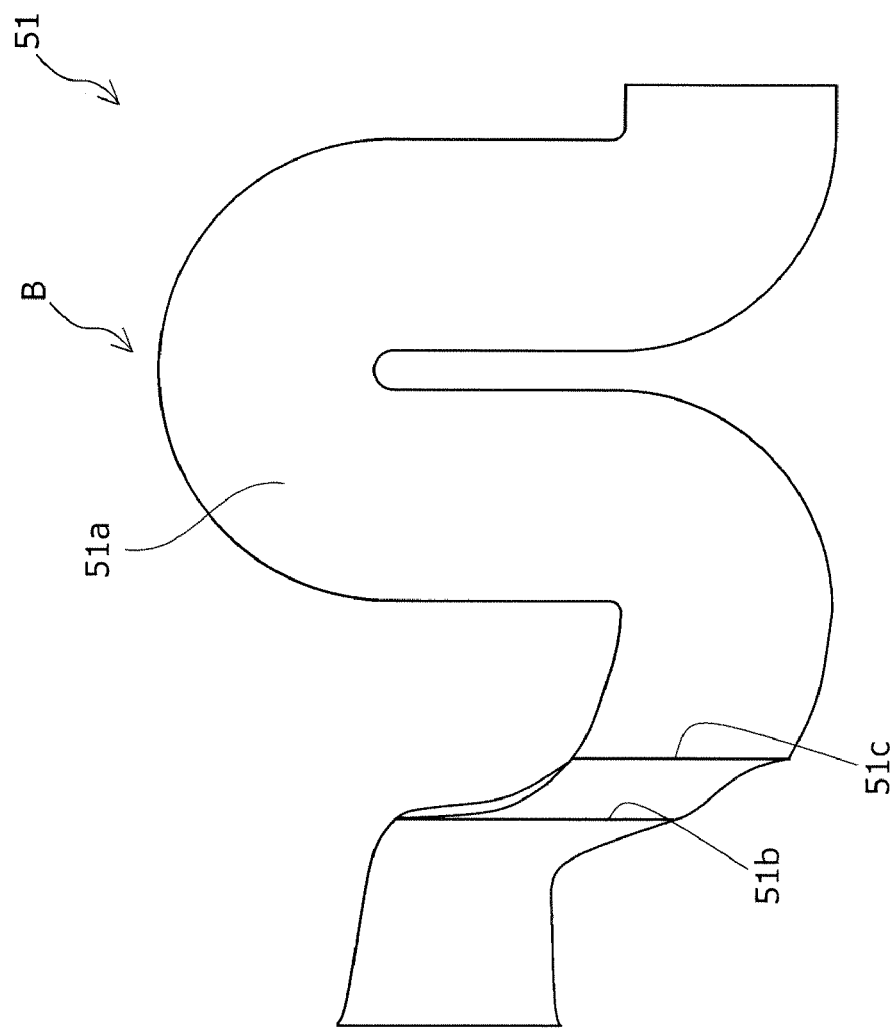
FIG. 10 is a plan view showing a flexible wiring board in an optical unit in accordance with a fourth embodiment of the present invention.
Figure 11:
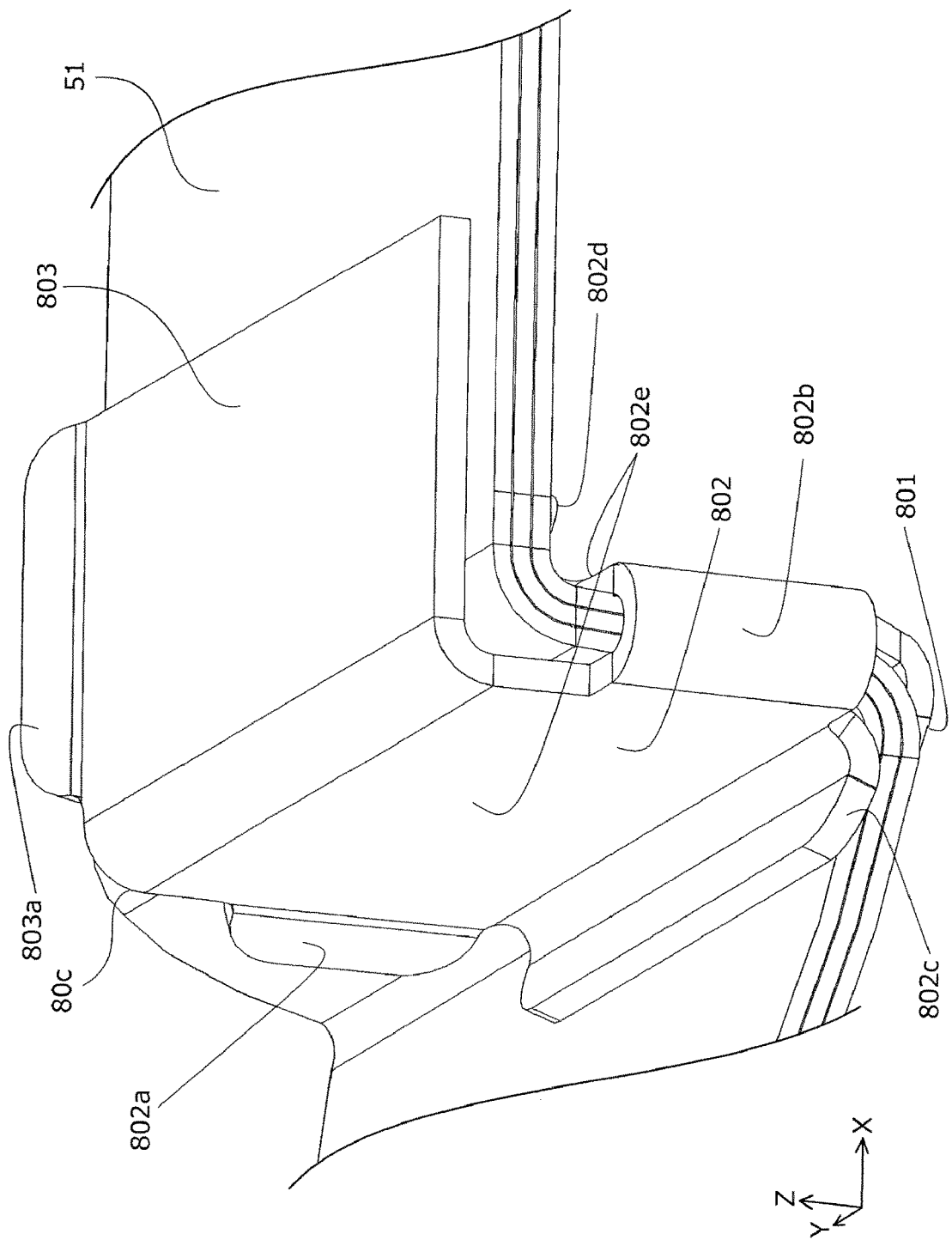
FIG. 11 is a perspective view showing a bending assist member and its peripheral portion in an optical unit in accordance with a fifth embodiment of the present invention.
Figure 12:
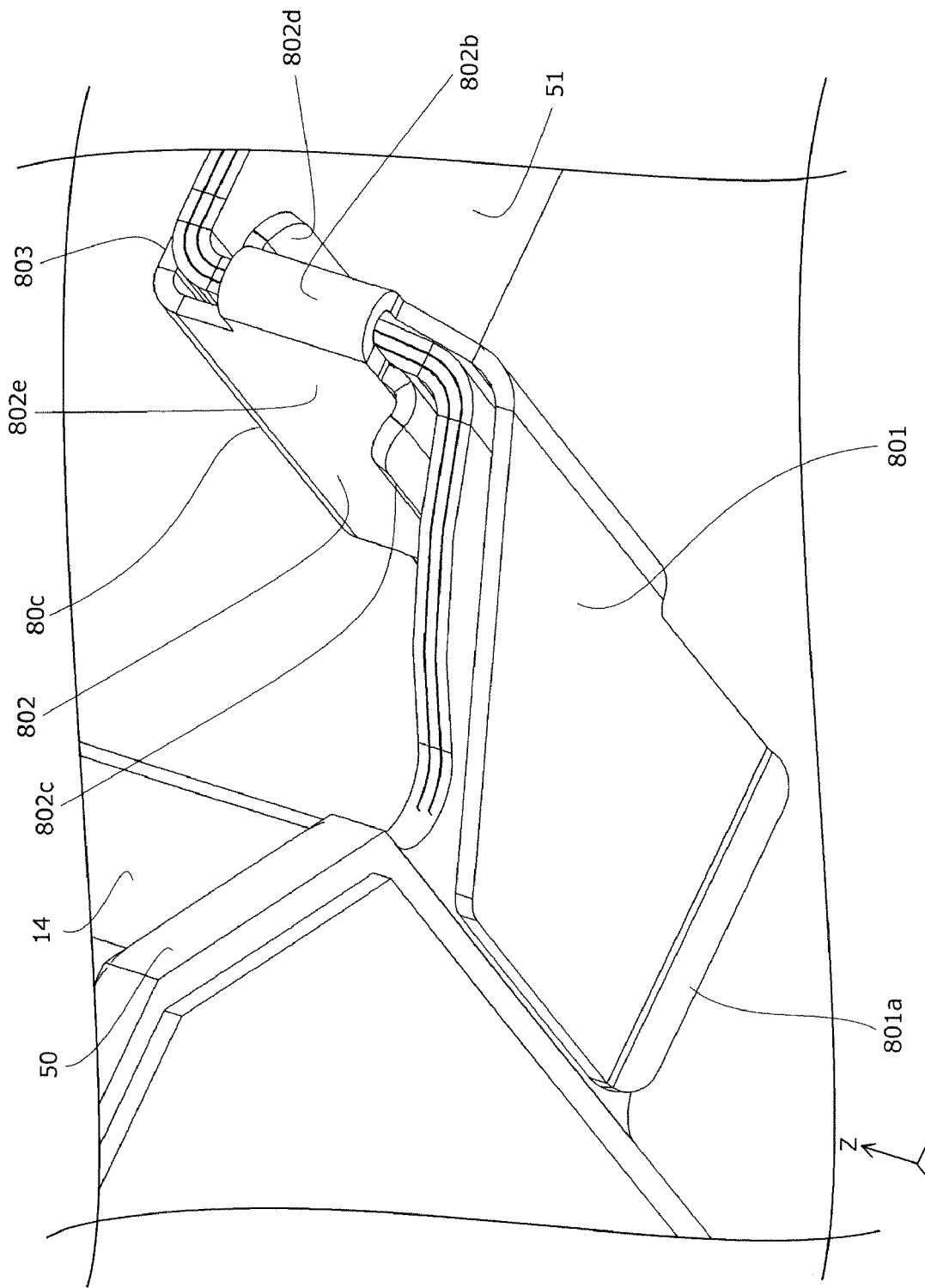
FIG. 12 is a perspective view showing a bending assist member and its peripheral portion in an optical unit in accordance with a fifth embodiment of the present invention which is viewed from a different angle in FIG. 11.

Next, an optical unit 10 in accordance with a fourth embodiment will be described below. FIG. 10 is a schematic view showing a flexible wiring board in an optical unit 10 in accordance with a fourth embodiment and is a view corresponding to FIG. 6 in the optical unit 10 of the first embodiment. In the fourth embodiment, the structure members common to the first embodiment through the third embodiment are indicated with the same reference signs and their detailed descriptions are omitted. In the fourth embodiment, the optical unit 10 has similar structures to the optical unit 10 of the first embodiment except a shape of the flat face region 51a.

As shown in FIG. 6, in the optical unit 10 in the first embodiment, the flat face region 51a is structured so that the flexible wiring board 51 is curved in a direction approaching the movable body 14 along the "X"-axis direction at the first curved part "B1", and that the flexible wiring board 51 is curved in a direction separating from the movable body 14 along the "X"-axis direction at the second curved part "B2". As described above, when the flat face region 51a is structured so that, in the curved part "B", the flexible wiring board 51 is curved in a direction approaching the movable body 14 or, in a direction separating from the movable body 14, a length of the flexible wiring board 51 is easily increased and a load applied to the flexible wiring board 51 can be easily and efficiently reduced.

On the other hand, as shown in FIG. 10, in the optical unit 10 in the fourth embodiment, in the flat face region 51a, the flexible wiring board 51 is curved in a curved part "B" along the "Y"-axis direction which intersects a direction approaching the movable body 14 and a direction separated from the movable body 14. As described above, a curving direction of the curved part "B" in the flat face region 51a is not limited specifically.

Fifth Embodiment

Next, an optical unit 10 in accordance with a fifth embodiment will be described below with reference to FIGS. 11 through 16. In the fifth embodiment, the structure members common to the first embodiment through the fourth embodiment are indicated with the same reference signs and their detailed descriptions are omitted. In the fifth embodiment, the optical unit 10 has similar structures to the optical unit 10 of the third embodiment except a shape of a bending assist member.

A bending assist member 80c in the optical unit 10 of the fifth embodiment is, as shown in FIGS. 11 through 16, structured so as to maintain the flexible wiring board 51 in a bent state that the flexible wiring board 51 is bent twice at an angle of 90 degrees. Specifically, two bending angles "Θ1" and "Θ2" (see FIG. 16) of the flexible wiring board 51 are the same and set at 90 degrees and their bending directions are opposite to each other. According to this structure, a bending structure of the flexible wiring board 51 can be simplified. In this case, the expression of "bending direction are opposite to each other" means that the flexible wiring board 51 is bent so that a fold which is a ridge-fold and a fold which is a valley-fold are formed on opposite faces at two bending positions.

Next, a detailed structure of the bending assist member 80c will be described below. The bending assist member 80c is provided with a plate part 801 which supports the flexible wiring board 51 on a side of the connection part 50a of the imaging element 50. Further, the bending assist member 80c is provided with a holding region 802 having two flat plate parts 802e, which are provided at an angle perpendicular to the plate part 801 so as to face each other, and a region 51d of the flexible wiring board 51 between the first bent part 51b and the second bent part 51c are sandwiched and held at a position between the two flat plate parts 802e. Further, the bending assist member 80c is provided with a plate part 803 which is provided at an angle perpendicular to the flat plate part 802e and supports the flat face region 51a of the flexible wiring board 51.

It is preferable to structure that, like the bending assist member 80c in this embodiment, the flexible wiring board 51 is held in the holding region 802 between two bent parts of the flexible wiring board 51. This is because that the flexible wiring board 51 is surely held by the bending assist member.

Further, it is preferable to structure that, like the bending assist member 80c in this embodiment, the plate part 801 and the plate part 803 are provided so as to contact with the flexible wiring board 51 on both outer sides with respect to the holding region 802 and support the flexible wiring board 51. When expressed in another manner, it is preferable that the bending assist member is provided at positions separated from the holding region 802 with the plate parts 801 and 803 which contact with the flexible wiring board 51 from outer sides in the bending directions and determine bending angles of the flexible wiring board 51 in the two bent parts (first bent part 51b and second bent part 51c). This is because that the bending angles can be easily restrained from deviating from predetermined angles by the plate parts 801 and 803.

Figure 13:
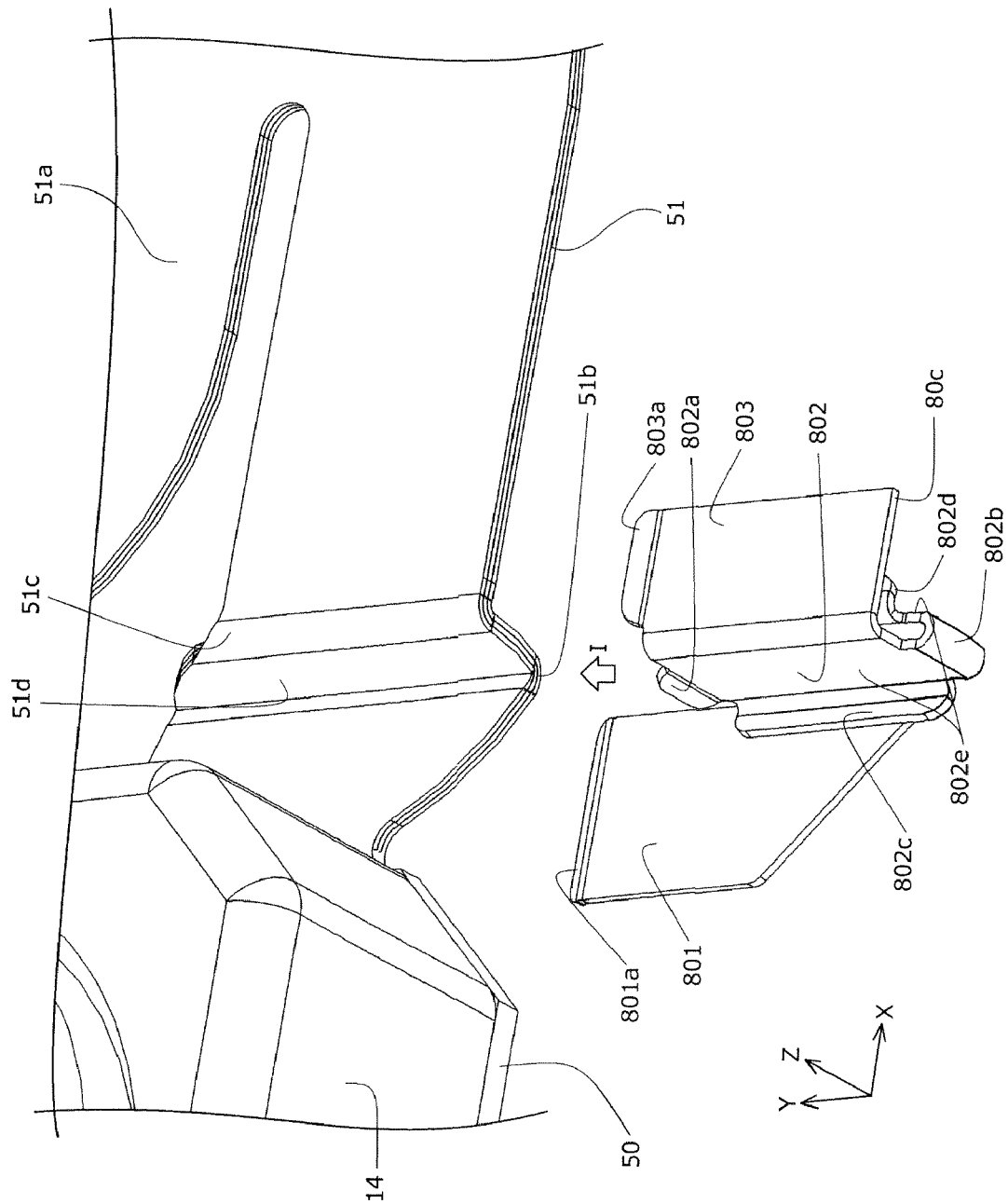
FIG. 13 is a perspective view showing a state that a bending assist member is detached in an optical unit in accordance with a fifth embodiment of the present invention.
Figure 14:
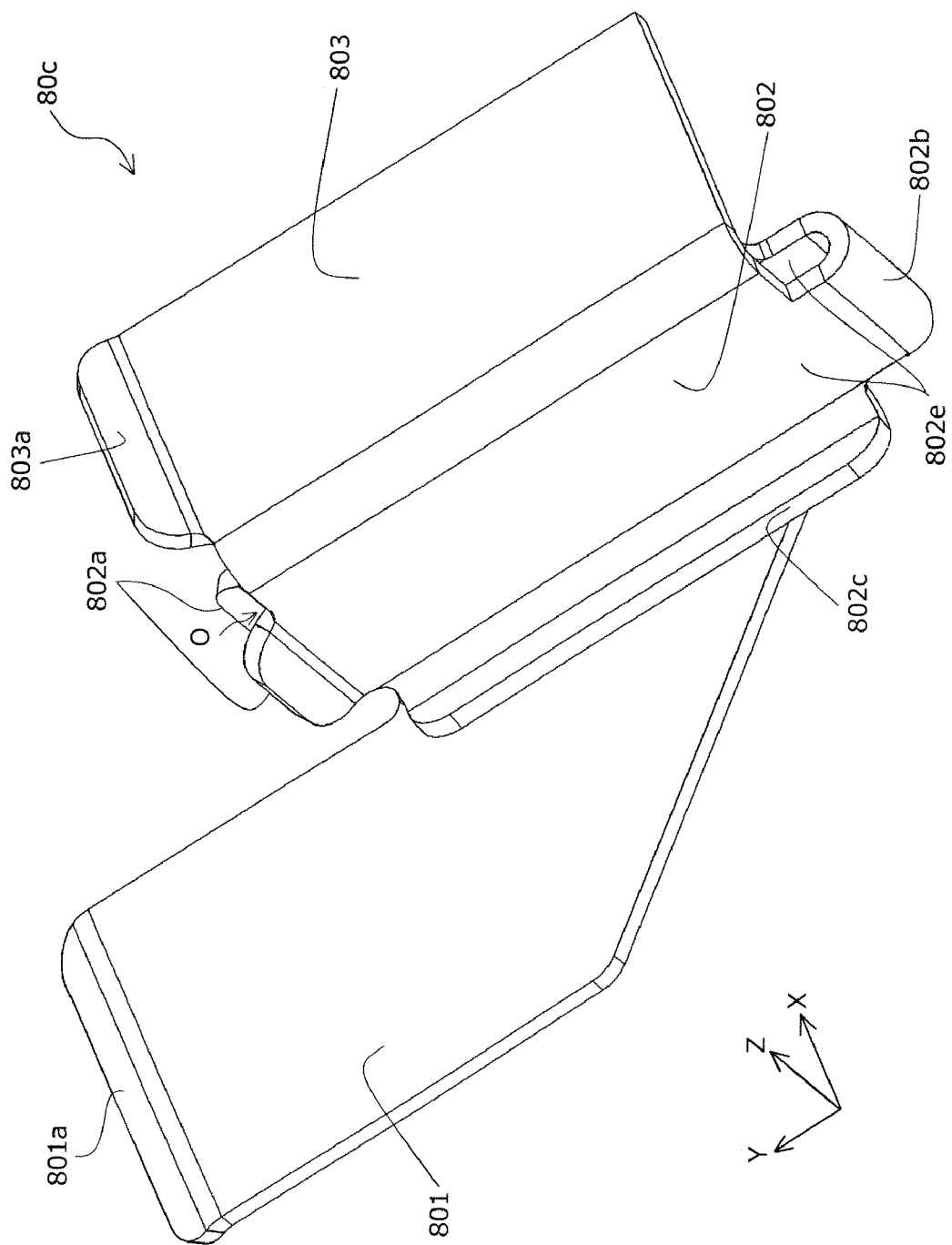
FIG. 14 is a perspective view showing a bending assist member in an optical unit in accordance with a fifth embodiment of the present invention.
Figure 15:
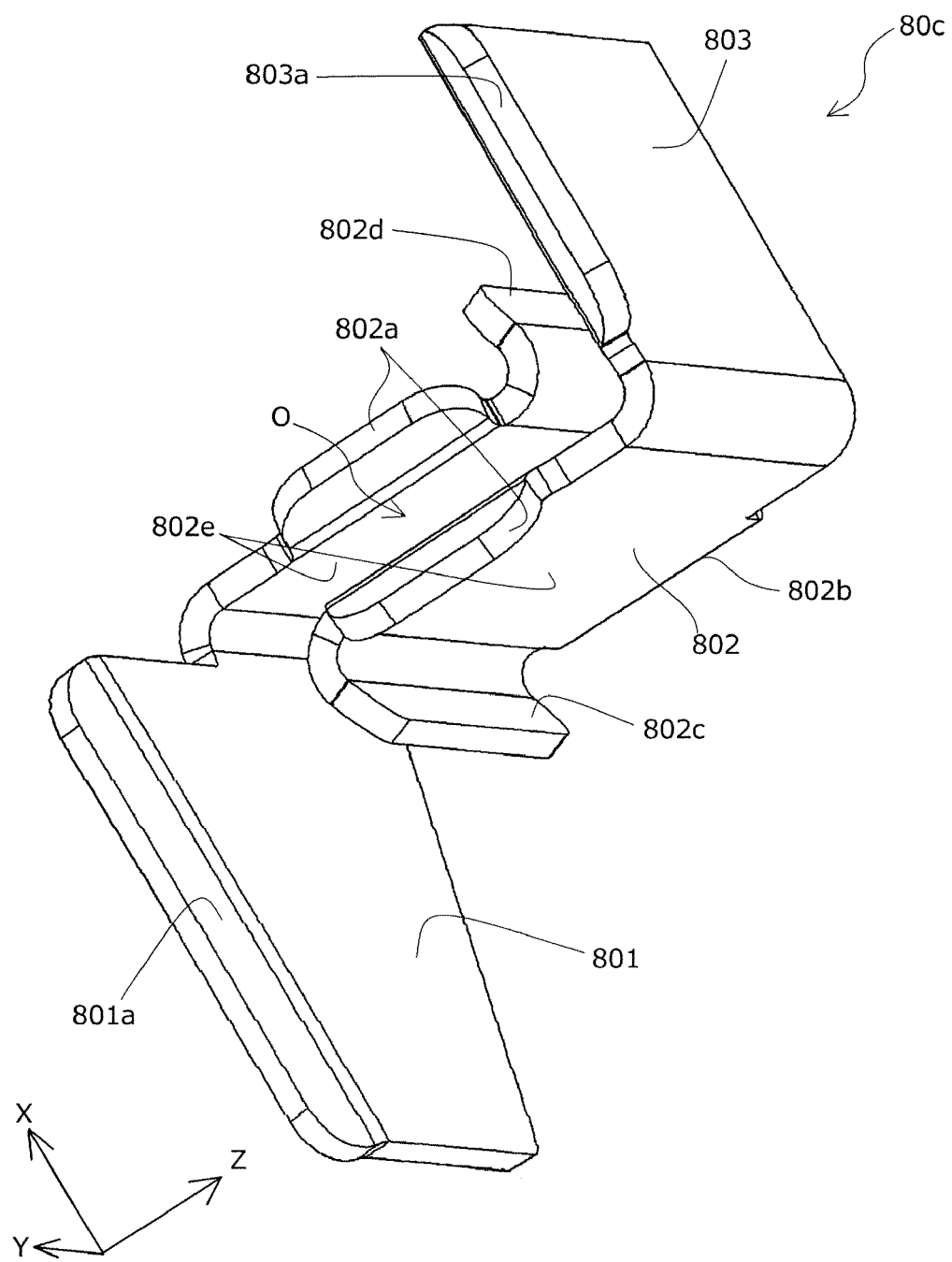
FIG. 15 is a perspective view showing a bending assist member in an optical unit in accordance with a fifth embodiment of the present invention which is viewed from a different angle in FIG. 14.
Figure 16:
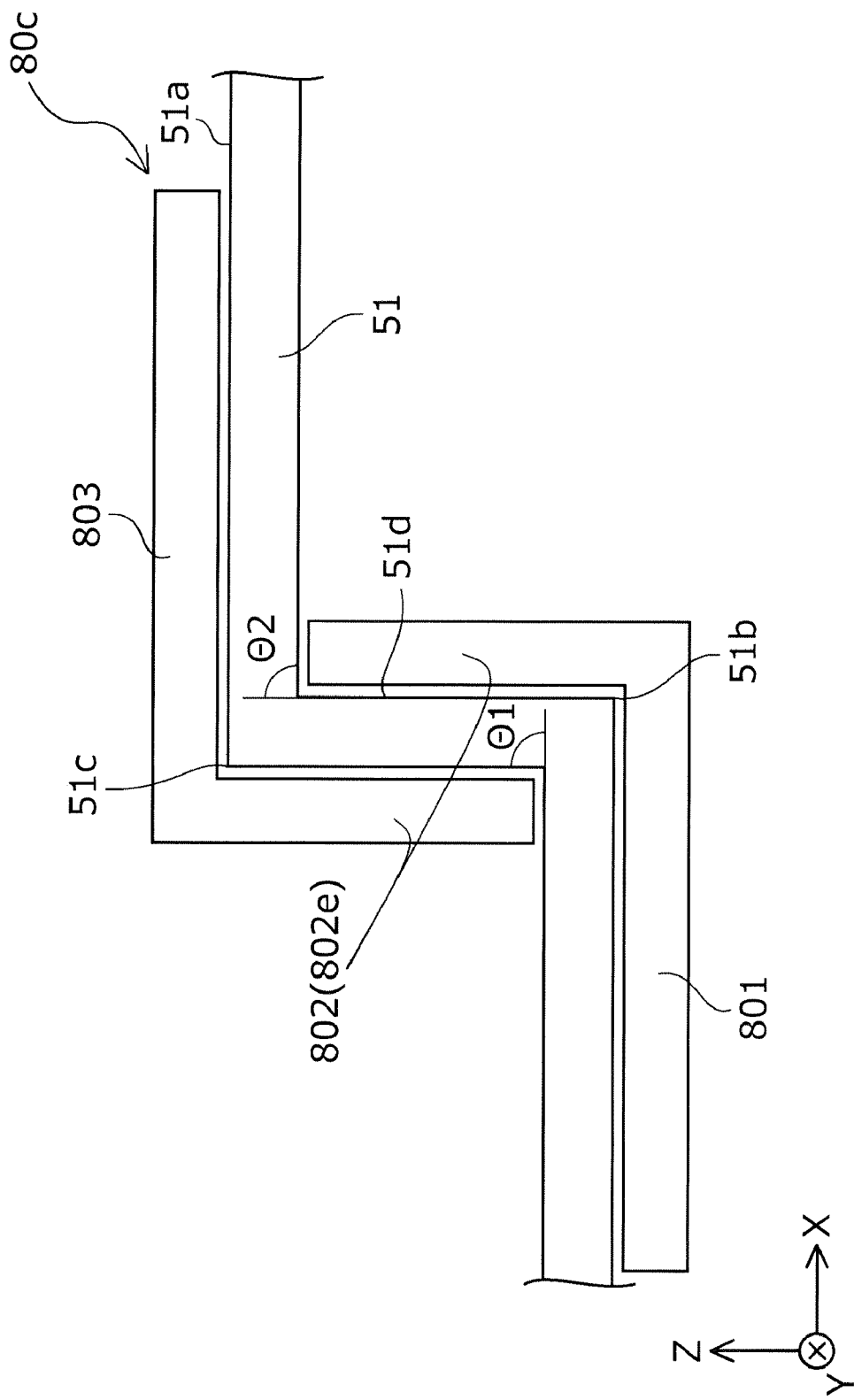
FIG. 16 is a schematic cross-sectional view showing a bending assist member and its peripheral portion in an optical unit in accordance with a fifth embodiment of the present invention.

In a case that the bending assist member 80c is to be attached to the flexible wiring board 51, the bending assist member 80c is disposed with respect to the flexible wiring board 51 as shown in FIG. 13 and, when the bending assist member 80c is moved in the inserting direction "I" with respect to the flexible wiring board 51 and thereby, the bending assist member 80c can be attached to the flexible wiring board 51. In this embodiment, the bending assist member 80c is provided with an opening part "O" in the holding region 802 as shown in FIGS. 14 and 15. The flexible wiring board 51 can be held by fitting the holding region 802 to the flexible wiring board 51 from the opening part "O" side. As shown in FIGS. 14 and 15, an insertion guide part 802a whose opening width becomes wider toward a tip end side is provided at tip ends of the flat plate parts 802e on the opening part "O" side. As described above, it is preferable that the opening part "O" is widened toward the tip end side. This is because that the bending assist member can be easily attached to the flexible wiring board 51.

In this embodiment, as shown in FIGS. 11 through 16, the flat plate part 802e is formed with a coming-off stop part 802b for preventing the holding region 802 from excessively moving and coming off in the inserting direction "I" with respect to the flexible wiring board 51 when the holding region 802 is fitted to the flexible wiring board 51 from the opening part "O" side. Further, the flat plate part 802e is provided at a position facing the plate part 801 with an inner side pressing part 802c which is capable of pressing the flexible wiring board 51 from an inner side in the bending direction. In addition, the flat plate part 802e is provided at a position facing the plate part 803 with an inner side pressing part 802d which is capable of pressing the flexible wiring board 51 from an inner side in the bending direction. The inner side pressing part 802c and the inner side pressing part 802d are bent in a curved surface shape toward an outer side in the bending direction for preventing damage of the flexible wiring board 51 when the flexible wiring board 51 is contacted.

Further, as shown in FIGS. 11 through 16, the plate part 801 is formed with an insertion guide part 801a in a plate shape which is curved to an opposite side to a support face for the flexible wiring board 51 so that, when the bending assist member 80c is to be attached to the flexible wiring board 51, the plate part 801 and the flexible wiring board 51 are not interfered with each other and the flexible wiring board 51 is not damaged. Similarly, the plate part 803 is formed with an insertion guide part 803a in a plate shape which is curved to an opposite side to a support face for the flexible wiring board 51 so that, when the bending assist member 80c is to be attached to the flexible wiring board 51, the plate part 803 and the flexible wiring board 51 are not interfered with each other and the flexible wiring board 51 is not damaged.

In this embodiment, as shown in FIG. 14 and the like, the plate part 801 is formed in a substantially trapezoid shape, and the plate part 803 is formed in a substantially rectangular shape. This is because that their shapes are matched as much as possible with the shape of the flexible wiring board 51 in a region supported by the plate part 801 and the shape of the flexible wiring board 51 in a region supported by the plate part 803. According to these shapes, the flexible wiring board 51 can be supported effectively.

Sixth Embodiment

Figure 17:
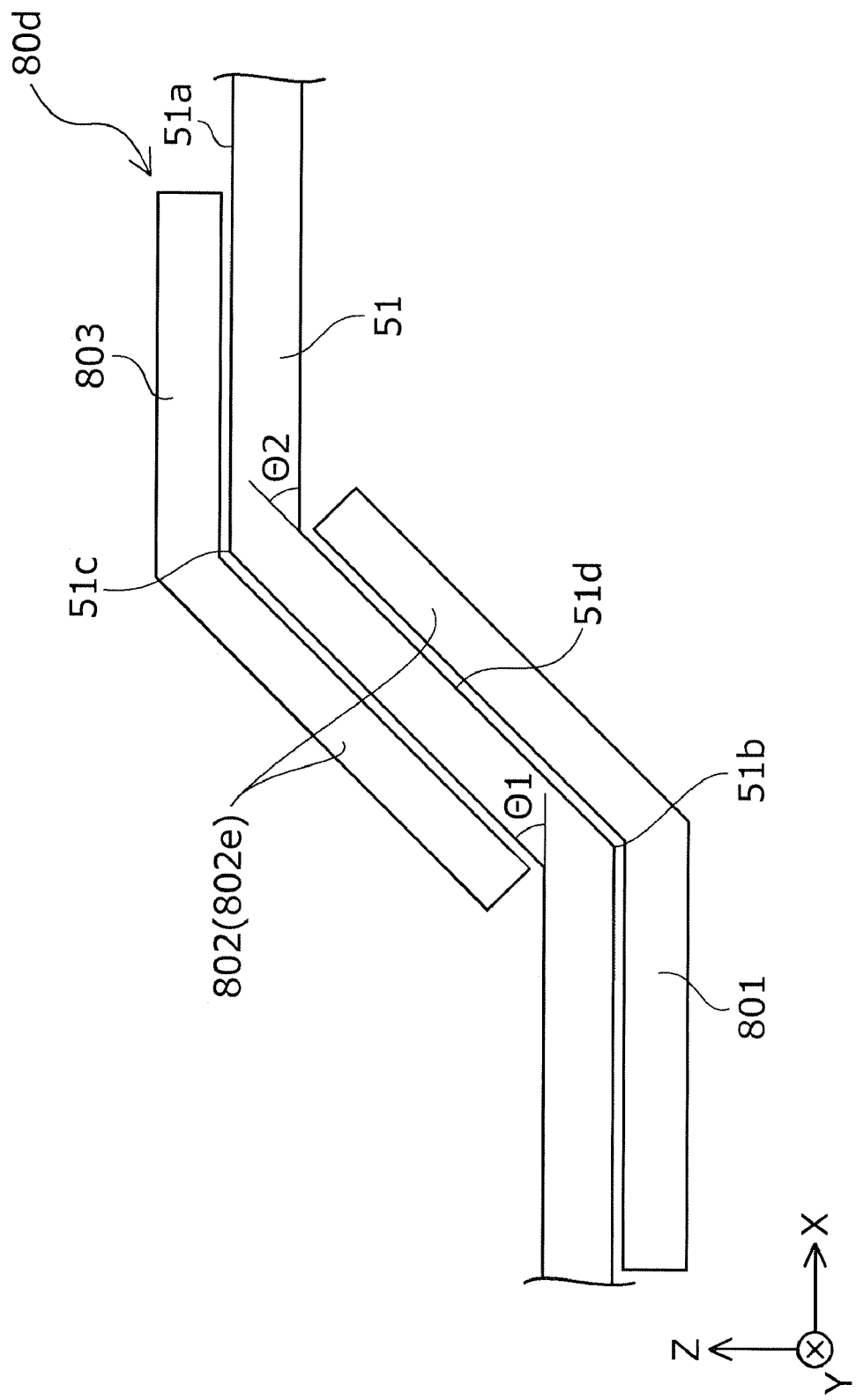
FIG. 17 is a schematic cross-sectional view showing a bending assist member and its peripheral portion in an optical unit in accordance with a sixth embodiment of the present invention.

Next, an optical unit 10 in accordance with a sixth embodiment will be described below with reference to FIG. 17. FIG. 17 is a view corresponding to FIG. 16 in the optical unit 10 of the fifth embodiment. In the sixth embodiment, the structure members common to the first embodiment through the fifth embodiment are indicated with the same reference signs and their detailed descriptions are omitted. In the sixth embodiment, the optical unit 10 has similar structures to the optical unit 10 of the fifth embodiment except a shape of a bending assist member.

As described above, in the optical unit 10 of the fifth embodiment, the flexible wiring board 51 is bent by 90 degrees at the first bent part 51b and the second bent part 51c, and the bending assist member 80c is structured so that the flexible wiring board 51 is maintained in a state that the flexible wiring board 51 is bent at a bending angle of 90 degrees at the first bent part 51b and the second bent part 51c. On the other hand, in the optical unit 10 in the sixth embodiment, as shown in FIG. 17, the flexible wiring board 51 is bent by about 60 degrees at the first bent part 51b and the second bent part 51c, and the bending assist member 80d is structured so that the flexible wiring board 51 is maintained in a state that the flexible wiring board 51 is bent at a bending angle of about 60 degrees at the first bent part 51b and the second bent part 51c.

It is preferable that the bending assist member is structured so as to maintain a state that the flexible wiring board 51 is bent twice at a bending angle of 90 degrees or less like the bending assist member 80c in the fifth embodiment 5 and the bending assist member 80d in the sixth embodiment. When the bending assist member is structured so as to be bent twice at a bending angle of 90 degrees or less, the flat face region 51a of the flexible wiring board 51 can be approached in the optical axis direction without excessively applying a load to the flexible wiring board 51.

Although the present invention has been shown and described with reference to a specific embodiment, various changes and modifications will be apparent to those skilled in the art from the teachings herein. For example, technical features in the above-mentioned embodiments corresponding to the technical features in the respective embodiments described in the summary of the invention can be appropriately substituted or combined for solving a part or all of the above-mentioned objectives or for achieving a part or all of the above-mentioned effects. Further, when the technical features are not described as essential structures in the present specification, the technical features may be appropriately omitted.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An optical unit comprising:
a movable body comprising an optical module;
a fixed body;
a support mechanism which turnably supports the movable body with respect to the fixed body with one or a plurality of directions intersecting an optical axis direction as a direction of a turning axis; and
a flexible wiring board whose one end is connected with a connection part provided in the movable body and which comprises a flat face region facing the optical axis direction, the flat face region being disposed with respect to the movable body on a side in a first intersecting direction which intersects the optical axis direction;
wherein the flat face region comprises a curved part which is curved without overlapping in the optical axis direction and is structured so that at least a part of the flat face region is overlapped with a position of the turning axis in the optical axis direction.

2. The optical unit according to claim 1, wherein
the flexible wiring board is, from a side of the one end connected with the connection part toward an other end side, bent at a first bent part so as to approach the position of the turning axis in the optical axis direction and bent at a second bent part on the other end side with respect to the first bent part and thereby the other end side structures the flat face region.

3. The optical unit according to claim 2, further comprising:
a bending assist member which assists to maintain a bent state of the flexible wiring board.

4. The optical unit according to claim 3, wherein
the bending assist member is structured so as to maintain the flexible wiring board in the bent state that the flexible wiring board is bent twice at a bending angle of 90 degrees or less.

5. The optical unit according to claim 4, wherein
the bending assist member is structured so that two bending angles of the flexible wiring board are same as each other and their bending directions are opposite to each other.

6. The optical unit according to claim 4, wherein
the bending assist member is structured so that the bending assist member holds the flexible wiring board in a holding region between two bent portions of the flexible wiring board.

7. The optical unit according to claim 6, wherein
the bending assist member comprises plate parts which are provided at positions separated from the holding region so as to contact with the flexible wiring board from an outer side in a bending direction to determine a bending angle of the flexible wiring board at the two bent portions.

8. The optical unit according to claim 6, wherein
the bending assist member comprises an opening part provided in the holding region and is structured so as to be capable of holding the flexible wiring board by fitting the holding region to the flexible wiring board from a side of the opening part, and
a tip end side of the opening part is widened.

9. The optical unit according to claim 1, wherein
the flexible wiring board is structured in a multilayer structure.

10. The optical unit according to claim 9, wherein
the flexible wiring board comprises a non-adhesion region where respective layers are not bonded to each other in a region of the multilayer structure.

11. The optical unit according to claim 1, further comprising:
a yawing turning axis along the first intersecting direction as the turning axis,
wherein the flat face region comprises a plurality of the curved parts, and
wherein the curved parts are line-symmetrically disposed in the flat face region with the yawing turning axis as a reference or point-symmetrically disposed in the flat face region when viewed in the optical axis direction.

12. The optical unit according to claim 1, wherein
in the flat face region, the flexible wiring board is curved in a direction approaching the movable body or in a direction separating from the movable body in the curved part.

13. An optical unit comprising:
a movable body comprising an optical module;
a fixed body;
a support mechanism which turnably supports the movable body with respect to the fixed body with one or a plurality of directions intersecting an optical axis direction as a direction of a turning axis; and
a flexible wiring board whose one end is connected with a connection part provided in the movable body and which comprises a flat face region facing the optical axis direction, the flat face region being disposed with respect to the movable body on a side in a first intersecting direction which intersects the optical axis direction;
wherein the flat face region comprises a curved part which is curved without overlapping in the optical axis direction; and
wherein the flexible wiring board comprises a bent part and is bent at the bent part so that the flat face region approaches a position of the turning axis in the optical axis direction with respect to the connection part.

14. The optical unit according to claim 13, further comprising:
a bending assist member which assists to maintain a bent state of the flexible wiring board.

15. The optical unit according to claim 14, wherein
the bending assist member is structured so as to maintain the flexible wiring board in the bent state that the flexible wiring board is bent twice at a bending angle of 90 degrees or less.

16. The optical unit according to claim 15, wherein
the bending assist member is structured so that two bending angles of the flexible wiring board are same as each other and their bending directions are opposite to each other.

17. The optical unit according to claim 15, wherein
the bending assist member is structured so that the bending assist member holds the flexible wiring board in a holding region between two bent portions of the flexible wiring board.

18. The optical unit according to claim 17, wherein
the bending assist member comprises plate parts which are provided at positions separated from the holding region so as to be contacted with the flexible wiring board from an outer side in a bending direction to determine a bending angle of the flexible wiring board at the two bent portions.

19. The optical unit according to claim 17, wherein
the bending assist member comprises an opening part provided in the holding region and is structured so as to be capable of holding the flexible wiring board by fitting the holding region to the flexible wiring board from a side of the opening part, and
a tip end side of the opening part is widened.

20. The optical unit according to claim 13, further comprising:
a yawing turning axis along the first intersecting direction as the turning axis,
wherein the flat face region comprises a plurality of the curved parts, and
wherein the curved parts are line-symmetrically disposed in the flat face region with the yawing turning axis as a reference or point-symmetrically disposed in the flat face region when viewed in the optical axis direction.

21. The optical unit according to claim 13, wherein
in the flat face region, the flexible wiring board is curved in a direction approaching the movable body or in a direction separating from the movable body in the curved part.

22. A bending assist member structured to maintain a flexible wiring board in a state that the flexible wiring board is bent at a first bent part and a second bent part, the bending assist member comprising:
a holding region which is provided between the first bent part and the second bent part and holds the flexible wiring board; and
plate parts which maintain the flexible wiring board in a state that the flexible wiring board is bent at a same bending angle of 90 degrees or less at the first bent part and the second bent part so that their bending directions are opposite to each other, and
the plate parts being provided at positions separated from the holding region so as to be contacted with the flexible wiring board from an outer side in the bending direction to determine a bending angle of the flexible wiring board at the first bent part and the second bent part.

23. The bending assist member according to claim 22, further comprising:
an opening part provided in the holding region,
wherein the flexible wiring board is capable of being held by fitting the holding region to the flexible wiring board from a side of the opening part, and
wherein a tip end side of the opening part is widened.

* * * * *